(12) United States Patent
Tyne

(10) Patent No.: US 12,065,053 B2
(45) Date of Patent: *Aug. 20, 2024

(54) PORTABLE ELECTRIC LOAD BANK APPARATUS, SYSTEM, AND METHOD OF OPERATION

(71) Applicant: Shelby Kenneth Campbell Tyne, San Diego, CA (US)

(72) Inventor: Shelby Kenneth Campbell Tyne, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/353,627

(22) Filed: Jul. 17, 2023

(65) Prior Publication Data

US 2023/0406135 A1 Dec. 21, 2023

Related U.S. Application Data

(63) Continuation of application No. 18/084,044, filed on Dec. 19, 2022, now Pat. No. 11,712,978, which is a continuation of application No. 17/842,368, filed on Jun. 16, 2022, now Pat. No. 11,571,982.

(51) Int. Cl.
*B60L 53/62* (2019.01)
*B60L 53/22* (2019.01)
*B60L 58/12* (2019.01)
*H02J 7/00* (2006.01)

(52) U.S. Cl.
CPC .............. *B60L 53/62* (2019.02); *B60L 53/22* (2019.02); *B60L 58/12* (2019.02); *H02J 7/0013* (2013.01); *H02J 7/0063* (2013.01)

(58) Field of Classification Search
CPC .......... B60L 53/62; B60L 53/22; B60L 58/12; H02J 7/0013; H02J 7/0063
See application file for complete search history.

(56) References Cited

U.S. PATENT DOCUMENTS

| | | | |
|---|---|---|---|
| 6,833,636 B1 | 12/2004 | Nestel | |
| 7,498,770 B1 | 3/2009 | Caldwell, II | |
| 11,571,982 B1 | 2/2023 | Tyne | |
| 11,712,978 B1 * | 8/2023 | Tyne | B60L 53/14 307/66 |
| 2018/0013318 A1 | 1/2018 | Nguyen | |
| 2021/0190873 A1 | 6/2021 | Jadwinski | |

\* cited by examiner

*Primary Examiner* — Jared Fureman
*Assistant Examiner* — Duc M Pham
(74) *Attorney, Agent, or Firm* — Esplin & Associates, PC

(57) ABSTRACT

This disclosure presents a portable load bank apparatus, system, method of control, and method of manufacture. A portable load bank apparatus may comprise one or more of a vehicle, a load bank, a set of batteries, a set of battery chargers, one or more processors, and/or other components. The load bank may be configured to perform a load test of an external power source. The processor(s) may be configured to cause one or more battery chargers in the set of battery chargers to direct an amount of a power output received by the load bank from the external power source to the set of batteries. The set of batteries may be used to provide electrical energy to one or more of an electric motor of the vehicle, one or more other electric vehicle, and/or other sources that may need electrical energy.

20 Claims, 4 Drawing Sheets

PORTABLE ELECTRIC LOAD BANK APPARATUS, SYSTEM, AND METHOD OF OPERATION

FIELD

This disclosure relates to generally to load banks, and in particular, to apparatuses, systems, and associated methods for configuring a portable load bank apparatus to utilize waste energy into battery charging for electric vehicles.

BACKGROUND

Load banks are testing devices that are used to simulate artificial electrical loads for the purposes of establishing proper and correct operation of power sources, such as generators and the like. A load bank tests these power sources by developing an electrical load. Various load configurations permit testing under different conditions. Load banks ensure the quality and reliability of the power output of power sources. Power may be measured as the rate, per unit time, at which electrical energy is transferred by an electric circuit. Load banks are used to verify the accuracy of output capacities by creating a variety of different loads that replicate real-world use. Some regulated institutions, such as hospitals, are required to test their power sources on a regular basis.

SUMMARY

The electrical power that is delivered to the load bank from a power source during a load test is typically converted into thermal energy at the load bank, and dissipated by rapid cooling using large fans to provide airflow. This is because a load bank typically services one purpose—to test the power source. The thermal energy dissipated by a load bank as a result of its typical use represents power that was, aside from the testing purposes, wasted.

Conventionally, load banks may be carted on a trailer towed by either a small commercial vehicle, or, in larger capacities, by large semi-trucks. A load bank operates independently, and after completion of a load test, is usually towed or driven back to the home base or next testing site. This requires the use of a fossil fuel powered vehicle to either tow the load bank on a trailer, or have it loaded onto a truck.

One or more implementations of the present disclosure propose a specially configured portable electric load bank apparatus, system, and method of operation, that solves an unmet need in the load bank and power source testing industry—utilizing the wasted energy. In particular, an apparatus of the present disclosure may comprise a load bank that may be permanently mounted on an electric commercial vehicle ("ECV"), such as a Semi-Trailer, Electric Powered Utility Vehicle, or the like. The load bank may comprise a combination of resistive/reactive components, capacitive components, and/or other components. Also mounted on the ECV may be a set of batteries. The batteries in the set of batteries may be the same as, or similar to, power sources that are used for the propulsion of electric vehicles. A function of the ECV may be to transport the mounted load bank from jobsite to jobsite, as well as use the waste energy to charge its own batteries and other batteries that may be used for charging other electric vehicles and/or other batteries and/or battery powered equipment (e.g., drones, bicycles, residential and/or commercial battery power storage, etc.). Accordingly, at least one of the battery sources may be used for the propulsion of the ECV. In the case of the semi-trailer type vehicle carrying a larger load bank, an addition of a fossil fueled generator may be mounted for contingency purposes.

A High Voltage Direct Current ("HVDC") charger may be used in combination with a Level 2 EV charger (and/or other use-specific battery chargers) and mounted on the ECV. The HVDC charger may derive its input voltage from the power source being tested through the load bank. The apparatus may be configured to determine an optimal charging power (e.g., rate, current, and/or voltage) and/or electrical energy to charge one or more of the batteries.

A specific simulated artificial load may be requested for the load bank from a power source being tested, so that the power source outputs electrical power that meets the requested load. The distribution of the output electrical power from the source may be determined such that electricity may be directed to flow to one or more chargers (to charge batteries) and/or the load bank (to dissipate as heat). The distribution may be based on priority, e.g., to one or more of the chargers for charging batteries for storage (and later charging of one or more external batteries), and/or for self-consumption (e.g., charging one or more batteries used specifically for powering an electric motor of the apparatus). By way of non-limiting illustration, an onboard computer may be configured to determine the required charging power (and/or energy) to charge the set of batteries and to apply a portion of the output electrical power (and/or energy) to the HVDC charger to charge the set of batteries. Any electrical energy over and above the requested charging power (in accordance with the artificial load requested) may be distributed amongst the resistive/reactive/capacitive components of the load bank and dissipated as thermal energy. Once the set of batteries have been satisfactorily charged to optimum capacity by the waste energy, the apparatus may utilize an EV charger to charge other EVs, other vehicles having batteries, and/or other battery storage devices. Depending on the amount of waste energy available, and/or the required energy (e.g., kWh) to replenish the set of batteries, a DC/DC converter may be used to supercharge EVs, should excess waste energy be available.

The ECV can now travel under its own propulsion to its following destination. The available travel range of the ECV may be determined. The apparatus may be configured to determine the amount of electrical power (and/or energy) required to reach the next destination of the ECV. Should the available range be further than the power (and/or energy) required to reach the destination (e.g., with a factor of safety or buffer for slow traffic, etc.) the residual battery power may be used for charging other EVs and/or other battery storage from the apparatus. The range needed to travel to the next destination, plus contingency range, may be essentially a zero-level of charge. In the event of a range miscalculation due to extenuating circumstances, a generator may be used as a backup. The energy being produced by the generator to increase the range may be metered and logged to establish wasted energy from sacrificial energy. In medium voltage applications, a generator traditionally used for fans and/or controls may be replaced with a set of battery packs with alternating consumption and charging, respectively. One or more implementations of the apparatus presented herein may solve a problem of using equipment at higher elevations where a diesel generator would be derated.

One or more implementations of a system presented herein may include one or more of a vehicle, a load bank, set of batteries, a set of battery chargers, one or more processors configured by machine-readable instruction, non-transitory electronic storage, server(s), computing platform(s), external power source(s), and/or other components. One or more of the components of the system, when mounted to the vehicle, may form a "portable load bank apparatus" of the present disclosure.

The load bank may be configured to cause an external power source to generate a power output as part of a load test of the external power source. The set of batteries may be configured to store electric energy. The set of batteries may be electrically coupled to the load bank and/or other components. The set of battery chargers may be configured to direct the flow of electricity to the set of batteries. The set of battery chargers may be electrically coupled between the load bank, the set of batteries, and/or other components.

The non-transitory electronic storage may include storage that is integrally coupled with a vehicle, included with a remotely located server, included in one or more computing platforms that communicate with the vehicle and/or server, and/or included in other locations. The one or more processors may include one or more of processor(s) integrally coupled with a vehicle, processor(s) of a remotely located server, processor(s) of one or more computing platforms, and/or other components.

The one or more processors may be configured by machine-readable instructions. Executing the machine-readable instructions may cause the one or more processors to facilitate control of a portable load bank to utilize waste energy into battery charging. The machine-readable instructions may include one or more computer program components.

A computer program component may be configured to obtain a request for power output by the external power source, as part of a load test by the load bank. The electrical energy from the power output may be obtained at the load bank, through an electrical coupling of the external power source and the load bank.

A computer program component may be configured to cause one or more battery chargers in the set of battery chargers to direct an amount of the power output obtained by the load bank to the set of batteries. The amount of the electrical energy from the power output directed from the load bank to the set of batteries may comprise a battery input power (and/or energy). The battery input power (and/or energy) may comprise the electrical energy that charges the set of batteries, either to a complete charge or other charged state.

A computer program component may be configured to cause a remaining power (and/or energy) from the power output to be converted to thermal energy by directing the energy to the load bank for dissipation as heat. The remaining power (and/or energy) may be measured as the power output less the battery input power (and/or energy).

These and/or other objects, features, and characteristics of the apparatus, system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

DETAILED DESCRIPTION

Figure 1:
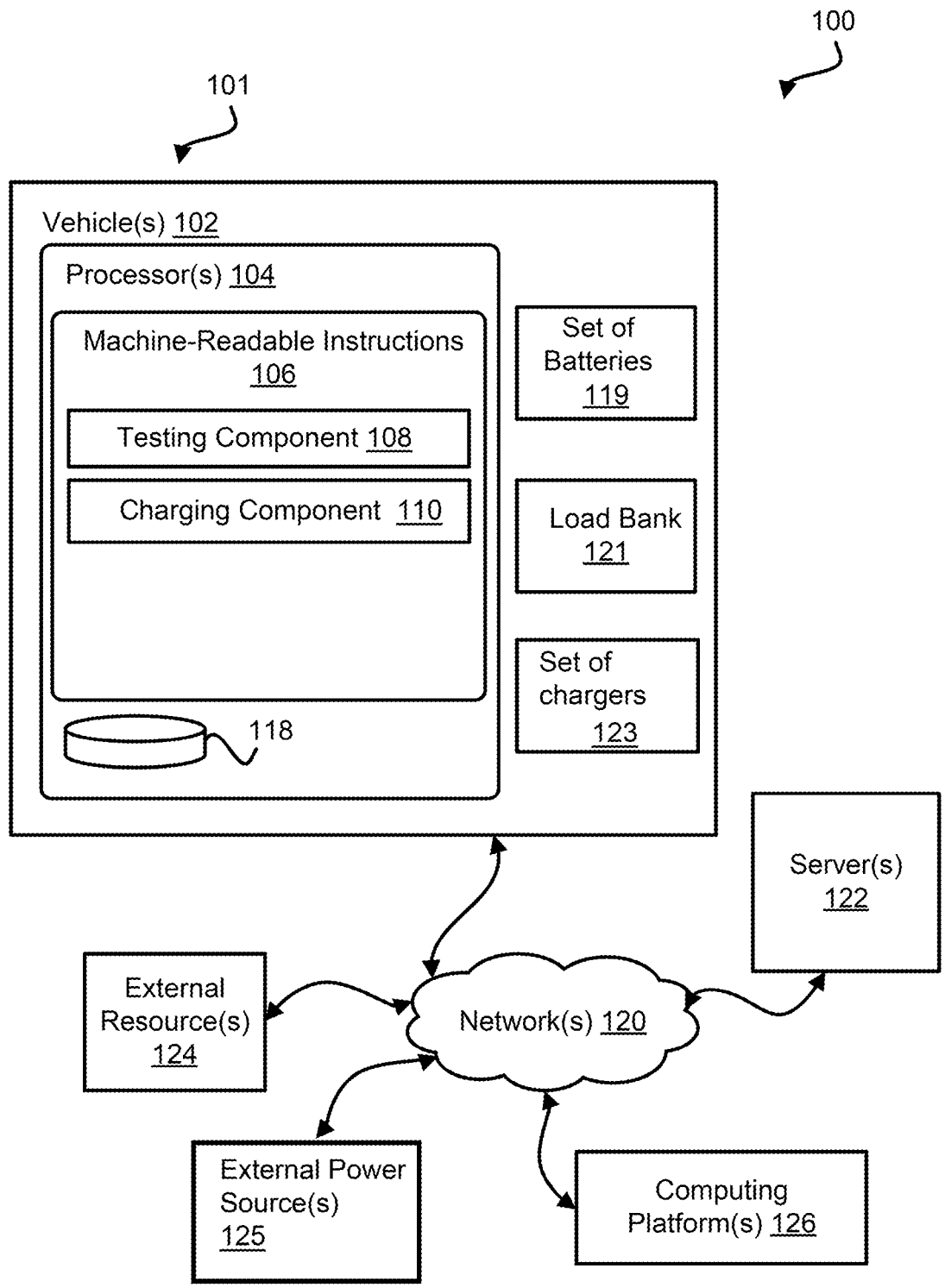
FIG. 1 illustrates a system configured to control a portable load bank apparatus to utilize waste energy into battery charging for electric vehicles, in accordance with one or more implementations.

FIG. 1 illustrates a system 100 configured to control a portable load bank apparatus 101 to utilize waste energy into battery charging for electric vehicles, in accordance with one or more implementations. The system 100 may include one or more of vehicle(s) 102, one or more processors 104, a set of batteries 119, a load bank 121, a set of battery chargers 123, server(s) 122, one or more computing platforms 126, one or more external power sources 125, one or more motors (not shown in FIG. 1) and/or other components.

Vehicle(s) 102 may represent an individual specially constructed vehicle and/or a set of similarly configured vehicles. Vehicle(s) 102 may be self-propelled. A vehicle may comprise a specially constructed electrical vehicle. The vehicle may comprise a vehicle made for commercial purposes. The vehicle may include one or more components upon which equipment may be mounted, removably and/or non-removably. By way of non-limiting illustration, vehicle may take the form of a van, truck, semi-truck, and/or other vehicles.

Vehicle(s) 102 may include (e.g., via permanent and/or removable mounting) one or more of one or more processors 104, non-transitory electronic storage 118, set of batteries 119, a load bank 121, set of battery chargers 123, and/or other components. Components may be mounted to vehicle(s) 102 through one or more mounting components and/or techniques. By way of non-limiting illustration, mounting may be accomplished by riveting, screwing, welding, strapping, and/or other techniques. The one or more processors 104 and/or electronic storage 118 may generally comprise a computer or computer system of vehicle(s) 102. A vehicle including the one or more of the processor(s) 104, non-transitory electronic storage 118, set of batteries 119, a load bank 121, set of battery chargers 123, and/or other components may generally define a portable load bank apparatus 101 of the present disclosure.

The set of batteries 119 may include one or more batteries. An individual battery of set of batteries 119 may be comprised of batteries conventionally used for the power source of electric vehicles. By way of non-limiting illustration, an individual battery may include one or more of a lithium-ion battery, nickel-metal hydride battery, lead-acid battery, and/or other batteries. In some implementations, the set of batteries 119 may be separated into one or more subsets. The subsets may be physically separated and and/or electrically separated by virtue of their electrical connections to individual ones of the chargers. By way of non-limiting illustration, the set of batteries 119 may include one or more of a first subset, a second subset, and/or other subsets. The first subset of batteries may be dedicated to providing power to the portable load bank apparatus 101. The second subset of batteries may be dedicated for power storage.

The set of battery chargers 123 may include one or more battery chargers. The set of battery chargers 123 may be configured to direct flow of power output from an external power source to the set of batteries 119 to charge one or more of individual batteries in the set, individual subsets of batteries, and/or the set of batteries 119 as a whole. In some implementations, the set of battery chargers 123 may include at least one high voltage direct current charger and/or other devices suitable for the intended purpose. In some implementations, the set of battery chargers 123 may include at least one EV charger (Level 2 or otherwise) configured to be removable and electrically coupled to individual electric vehicles to charge batteries of the individual electric vehicles via the second subset of batteries.

The load bank 121 may comprise a conventional load bank configured to be mounted on a vehicle. In some implementations, load bank 121 may comprise a load bank that is specially adapted and/or constructed to have specifications, dimensions, and/or other aspects that are specially configured for mounting on a vehicle. The load bank 121 may include one or more of a housing, ventilation louvers, a ventilation grid, rapid cooling fans, and/or other components. In some implementations, the load bank 121 may include specially constructed circuity, connectors, and/or other components (not shown in FIG. 1), configured to divert at least some of the power output received from an external power source other components of the system 100. By way of non-limiting illustration, an electrically coupling (e.g., cable, set of cables, etc.) may be mounted within the onboard electronics (e.g., resistive/reactive component, capacitive components, and/or other components) of the load bank 121 which allows at least some of the power output received at the load bank 121 to travel out of the load bank 121 to the set of battery chargers 123 and/or other components. A controller, switch, relay, and/or other devices may be used to facilitate diverting power out of the load bank 121.

External power source(s) 125 may represent an individual power source and/or a set of power sources. An external power source may include one or more of a generator, uninterruptible power supply (UPS), and/or other devices.

In FIG. 1, the non-transitory electronic storage 118 may be configured to store information utilized by processor(s) 104, one or more servers 122, one or more computing platforms 126, and/or other components of system 100. In some implementations, vehicle(s) 102 may have a dedicated display (not shown in FIG. 1) through which graphical user interface(s) are displayed to allow users to interface directly with processor(s) 104 and/or other components of the system 100.

In some implementations, server(s) 122 may be configured to provide remote hosting of features and/or functions of machine-readable instructions 106 to vehicle(s) 102, computing platform(s) 126, and/or other components. By way of non-limiting illustration, server(s) 122 may include machine-readable instructions which are the same as, or similar to, machine-readable instructions 106. Vehicle(s) 102, server(s) 122, and/or computing platform(s) 126 may be remotely located from one another. The server(s) 122 may communicate with other components of the system 100 via client/server architecture, and/or other communication schemes. By way of non-limiting illustration, individual computing platforms of one or more computing platforms 126 may download an application (e.g., non-transitory electronically stored information) configured to provide access to features and/or functions of machine-readable instructions 106. For example, individual computing platforms may present graphical user interfaces through which users interact with vehicle(s) 102 and/or system 100 as a whole.

Individual computing platforms may include one or more of a mobile computing platform (e.g., one or more of a cellular telephone, a smartphone, a laptop, a tablet computer, and/or other mobile platforms), a stationary computing platform (e.g., a desktop computer), and/or other computing platforms.

In some implementations, vehicle(s) 102 and/or computing platform(s) 126 my include devices configured to present and/or generate content. Content may include visual and/or audio content. By way of non-limiting illustration, vehicle(s) 102 and/or computing platform(s) 126 may include a display configured to present visual content. The visual content may include one or more of individual images, image sequences, video, text, and/or other content. Presentation via a display may be facilitated by a graphics processing unit (GPU) and/or other components incorporated into vehicle(s) 102 and/or computing platform(s) 126. A display may include one or more of screen, a touchscreen, a monitor, a head-mounted display, a set of screens, and/or other displays.

The non-transitory electronic storage 118 may include storage that is integrally coupled with a vehicle, included with server(s) 122, included in one or more computing platforms 126, and/or included in other locations. The non-transitory electronic storage 118 may store information utilized by one or more components of the system 100. By way of non-limiting illustration, the information may include computer program components and/or other information.

The one or more processors 104 may be configured by machine-readable instructions 106. Executing machine-readable instructions 106 may cause one or more processors 104 to facilitate controlling a portable load bank apparatus 101 and/or other components. The machine-readable instructions 106 may include one or more computer program components. The one or more computer program components may include one or more of a testing component 108, a charging component 110, and/or other components.

The testing component 108 may be configured to obtain a request for power output by external power source(s) 125, as part of a load test being performed by the load bank 121. By way of non-limiting illustration, a display may be configured to present a user interface through which a user may submit a request for power output. The request may include one or more of an amount of the power output, timing of the power output (e.g., when to start, when to stop, etc.), and/or other information.

The testing component 108 may be configured cause the external power source to generate electricity as part of a load test of the external power source. In response to the request, the external power source(s) 125 may be activated such that a power output may be generated. By way of non-limiting illustration, submission of the request may cause the sending an electrical signal (e.g., duty cycle commands corresponding to a desired load) to external power source(s) 125 which causes the external power source(s) 125 to be powered "on." The power output may be obtained at the load bank 121, through an electrical coupling of the external power source(s) 125 and the load bank 121.

The charging component 110 may be configured to cause one or more battery chargers in the set of battery chargers 123 to direct an amount of the power output obtained by the load bank 121 to the set of batteries 119. The amount of the power output directed from the load bank 121 to the set of batteries may comprise a battery input power (and/or energy). The battery input power (and/or energy) may comprise the electrical energy that charges the set of batteries 119, either to a complete charge or other charged state. It is noted that while some descriptions herein describes the distribution of electricity as a measure of power (e.g., rate, per unit time, at which electrical energy is transferred), this is for illustrative purposes only. Those skilled in the art may appreciate that the distribution may alternatively and/or concurrently be based measures of electrical energy, and/or other measures.

In some implementations, the charging component 110 may be configured to determine the battery input power (and/or energy) based on a current state of charge of the set of batteries 119. By way of non-limiting illustration, a current state of charge of the set of batteries 119 may be measured through a battery monitoring system (not shown in FIG. 1). One or more of voltage, amperage, and/or ampere hours remaining may be measured through a battery monitoring system (BMS) and/or apparatus suitable for the intended purpose. The battery monitoring system may be integrally coupled to the vehicle(s) 102. The BMS may prevent operation outside the set of batteries 119's safe operating area. By way of non-limiting illustration, a BMS may include one or more of an internal switch (such as a relay or solid state device) which is opened if a battery is operated outside its safe operating area, ability to request the devices to which a battery is connected to reduce or even terminate using the battery, ability to actively control the environment (e.g., such as through heaters, fans, air conditioning or liquid cooling), and/or other features and/or functionality.

In some implementations, the charging component 110 may be configured to determine an amount of travel power (and/or energy) the portable load bank apparatus 101 may need to reach a destination. The charging component 110 may be configured to determine the battery input power (and/or energy) based on the amount of travel power (and/or energy), so that the amount of charge of one or more batteries may be sufficient to supply the amount of travel power (and/or energy).

In some implementations, the charging component 110 may be configured to cause a remaining power (and/or energy) from the power output to be converted to thermal energy by the load bank 121 and/or other components, and dissipated as heat. The remaining power (and/or energy) may be measured as the power output less the battery input power (and/or energy). Through the active charging of batteries using the power output from an external power source, the portable load bank apparatus 101, and/or system 100, is now able reduce the amount of "waste" energy that is the consequence of load tests.

In some implementations, the testing component 108 may be configured to obtain an indication that the load test is complete. The indication may be derived from one or more of a duration of the load test ending, a predetermined amount of energy being supplied (e.g., kilowatt-hour output being reached), and/or other indications.

The testing component 108 may be configured to cause a reduction in the power output by an external power source. In some implementations, the external power source's output may be slowed reduced in power for safety reasons and/or for the proper functioning of the source. Upon reaching a safe or predetermined reduced power output, the testing component 108 may be configured to cause the load bank 121 to be shut down. Upon reaching a safe or predetermined reduced power output, the testing component 108 may be configured to cause the external power source to be shut down. In some implementations, causing actions at the external power source may be accomplished through control signals or commands being generated and sent from the processor(s) 104 to the external power source.

By way of non-limiting illustration, a 100 kW load on the load bank 121 from a generator. Traditionally, the entire 100 kW would be dissipated as heat from a load bank during and/or after a test. Now, with the portable load bank apparatus 101 and/or system 100, at least some (if not all) of that energy can be utilized to charge one or more batteries. Those batteries, in turn, may power an electric vehicle carrying the load bank 101, other electric vehicles that need a charge, and/or other batteries. By way of non-limiting illustration, from that 100 kW that is requested, 25 kW (or other amount) may be delivered to an HVDC charger to charge one or more batteries, while the other 75 kW (or other amount) may be dissipated as heat. These values are provided for illustrative purposes only and are not to be considered limiting.

Figure 4:
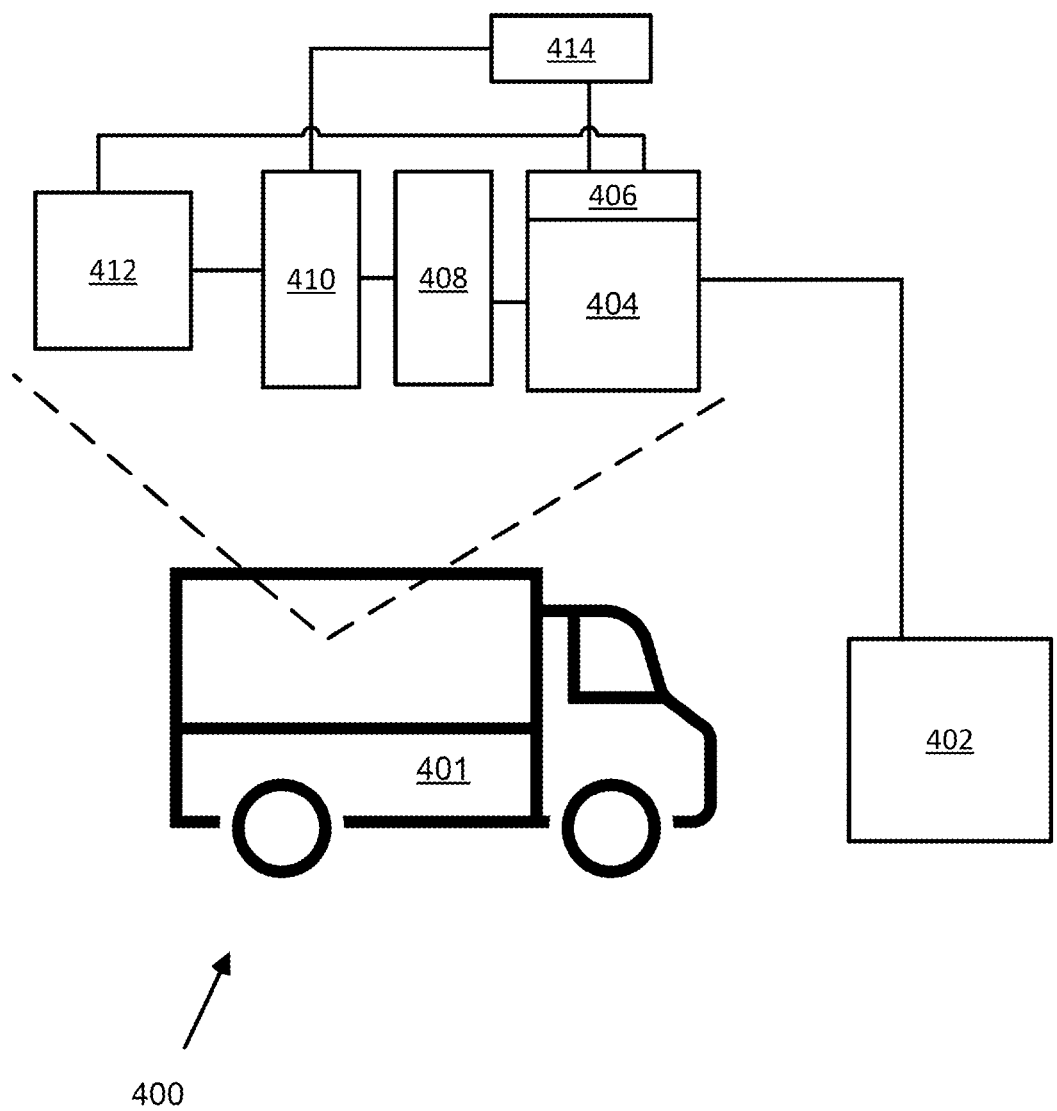
FIG. 4 illustrates a portable load bank apparatus, in accordance with one or more implementations.

FIG. 4 illustrates a portable load bank apparatus 400, in accordance with one or more implementations. Also shown is an external power source 402, such as a generator that may require load testing. The portable load bank apparatus 400 may be the same as or similar to portable load bank apparatus 101 described with respect to FIG. 1.

The portable load bank apparatus 400 may be comprised of one or more of an electric vehicle 401, a load bank 404, one or more processors 406 (e.g., onboard computer), a set of battery chargers 408, a set of batteries 410, an electric vehicle propulsion system 412 (e.g., one or more electric motors), a battery monitoring system 414, and/or other components. The elements shown using reference numerals 404 to 412 refer to components that may be integrally coupled (e.g., mounted) within, on, or otherwise to, vehicle 401. The presentation of those elements above and outside of vehicle 401 is merely provided for illustrative purposes as those elements are intended to be integrated with vehicle 401. The solid lines represent preferred electrical coupling between components; however, other coupling arrangements/schemes may be employed. Accordingly, FIG. 4 is merely provided to aid a person of ordinary skill in the art to understand at least one implementation of the present disclosure.

Returning to FIG. 1, vehicle(s) 102, one or more servers 122, one or more computing platforms 126, external resource(s) 124, external power source(s) 125, and/or other components may be operatively linked via one or more electronic communication links. For example, such electronic communication links may be established, at least in part, via one or more networks 120. One or more networks 120 may include wireless networks (e.g., Internet, Bluetooth, etc.), wired networks (e.g., cables, wires, etc.), and/or other networks. It will be appreciated that this is not intended to be limiting and that the scope of this disclosure includes implementations in which components of system 100 may be operatively linked via some other communication media.

External resource(s) 124 may include sources of information, hosts, and/or providers of information outside of system 100, external entities participating with system 100, and/or other resources. In some implementations, some or all of the functionality attributed herein to external resource(s) 124 may be provided by resources included in system 100. By way of non-limiting illustration, external entities may include one or more of infrastructure of locations that have individual external power sources. For example, an external entity may include the infrastructure of one or more of hospitals, assisted living centers, and/or other locations.

Processor(s) 104 may include communication lines or ports to enable the exchange of information with one or more of a network, server(s) 122, computing platform(s) 126, set of batteries 119, load bank 121, set of chargers 123, and/or other components. Illustration of processor(s) 104 in FIG. 1 is not intended to be limiting. Processor(s) 104 may include a plurality of hardware, software, and/or firmware components operating together to provide the functionality attributed herein to processor(s) 104. For example, processor(s) 104 may be implemented by a cloud of computing platforms operating together as processor(s) 104.

Electronic storage 118 may include electronic storage media that electronically stores information. The electronic storage media of electronic storage 118 may include one or both of system storage that is provided integrally (i.e., substantially non-removable) with vehicle(s) 102 and/or removable storage that is removably connectable to vehicle(s) 102 via, for example, a port or a drive. A port may include a USB port, a firewire port, and/or other port. A drive may include a disk drive and/or other drive. Electronic storage 118 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. The electronic storage 118 may include one or more virtual storage resources (e.g., cloud storage, a virtual private network, and/or other virtual storage resources). Electronic storage 118 may store software algorithms, information determined by processor(s) 104, information received from computing platform(s) 126 and/or server(s) 122, and/or other information that enables system 100 to function as described herein.

Processor(s) 104 may be configured to provide information-processing capabilities in vehicle(s) 102. As such, processor(s) 104 may include one or more of a digital processor, physical processor(s), an analog processor, a digital circuit designed to process information, an analog circuit designed to process information, a state machine, and/or other mechanisms for electronically processing information. Although processor(s) 104 is shown in FIG. 1 as a single entity, this is for illustrative purposes only. In some implementations, processor(s) 104 may include one or more processing units. These processing units may be physically located within the same device, or processor(s) 104 may represent processing functionality of a plurality of devices operating in coordination. The processor(s) 104 may be configured to execute components 108 and/or 110. Processor(s) 104 may be configured to execute components 108 and/or 110 by software; hardware; firmware; some combination of software, hardware, and/or firmware; and/or other mechanisms for configuring processing capabilities on processor(s) 104.

It should be appreciated that although components 108 and/or 110 are illustrated in FIG. 1 as being co-located within a single processing unit, in implementations in which processor(s) 104 includes multiple processing units, one or more of components 108 and/or 110 may be located remotely from the other components or from the vehicle(s) 102. While computer program components are described herein as being implemented via processor(s) 104 through machine readable instructions 106, this is merely for ease of reference and is not meant to be limiting. In some implementations, one or more functions of computer program components described herein may be implemented via hardware (e.g., dedicated chip, field-programmable gate array). One or more functions of computer program components described herein may be one or more of software-implemented, hardware-implemented, and/or software and hardware-implemented. The description of the functionality provided by the different components 108 and/or 110 described above is for illustrative purposes and is not intended to be limiting, as any of components 108 and/or 110 may provide more or less functionality than is described. For example, one or more of components 108 and/or 110 may be eliminated, and some or all of its functionality may be provided by other ones of components 108, 110, and/or other components. As another example, processor(s) 104 may be configured to execute one or more additional components that may perform some or all of the functionality attributed to one of components 108 and/or 110.

Figure 2:
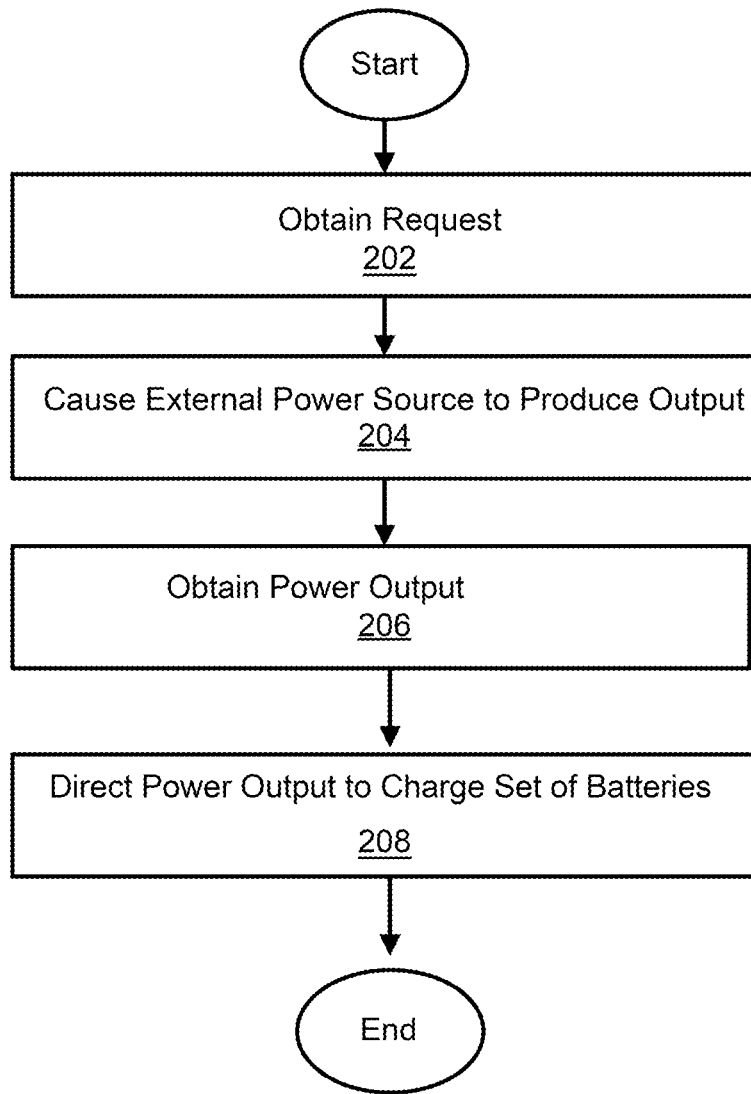
FIG. 2 illustrates a method to control a portable load bank apparatus to utilize waste energy into battery charging for electric vehicles, in accordance with one or more implementations.

FIG. 2 illustrates a method 200 to control a portable load bank apparatus, in accordance with one or more implementations. The operations of method 200 presented below are intended to be illustrative. In some implementations, method 200 may be accomplished with one or more additional operations not described, and/or without one or more of the operations discussed. Additionally, the order in which the operations of method 200 are illustrated in FIG. 2 and described below is not intended to be limiting.

In some implementations, method 200 may be implemented in a system comprising one or more processing devices (e.g., a physical processor, a digital processor, an analog processor, a digital circuit designed to process information, an analog circuit designed to process information, a state machine, and/or other mechanisms for electronically processing information), storage media storing machine-readable instructions, one or more vehicles, one or more external power sources, and/or other components. The one or more processing devices may include one or more devices executing some or all of the operations of method 200 in response to instructions stored electronically on electronic storage media. The one or more processing devices may include one or more devices configured through hardware, firmware, and/or software to be specifically designed for execution of one or more of the operations of method 200.

At an operation 202, a request may be obtained for a power output by an external power source as part of a load test. In some implementations, operation 202 may be performed by one or more processors executing a testing component the same as or similar to testing component 108 (shown in FIG. 1 and described herein).

At an operation 204, the external power source may generate electricity as part of the load test of the external power source. In some implementations, operation 204 may be performed by one or more processors executing a testing component the same as or similar to testing component 108 (shown in FIG. 1 and described herein).

At an operation 206, the power output generated by the external power source may be obtained at the load bank. In some implementations, operation 206 may be accomplished through electrical coupling of the external power source to the load bank.

At an operation 208, one or more battery chargers in a set of battery chargers may direct an amount of the power output obtained by the load bank to a set of batteries. The amount of the power output directed from the load bank to the set of batteries may comprise a battery input power (and/or energy) that charges the set of batteries. A remaining power (and/or energy) from the power output may be converted to thermal energy by the load bank and dissipated as heat. The remaining power (and/or energy) being the power output less the battery input power (and/or energy). In some implementations, operation 208 may be performed by one or more processors executing a charging component the same as or similar to charging component 110 (shown in FIG. 1 and described herein).

Figure 3:
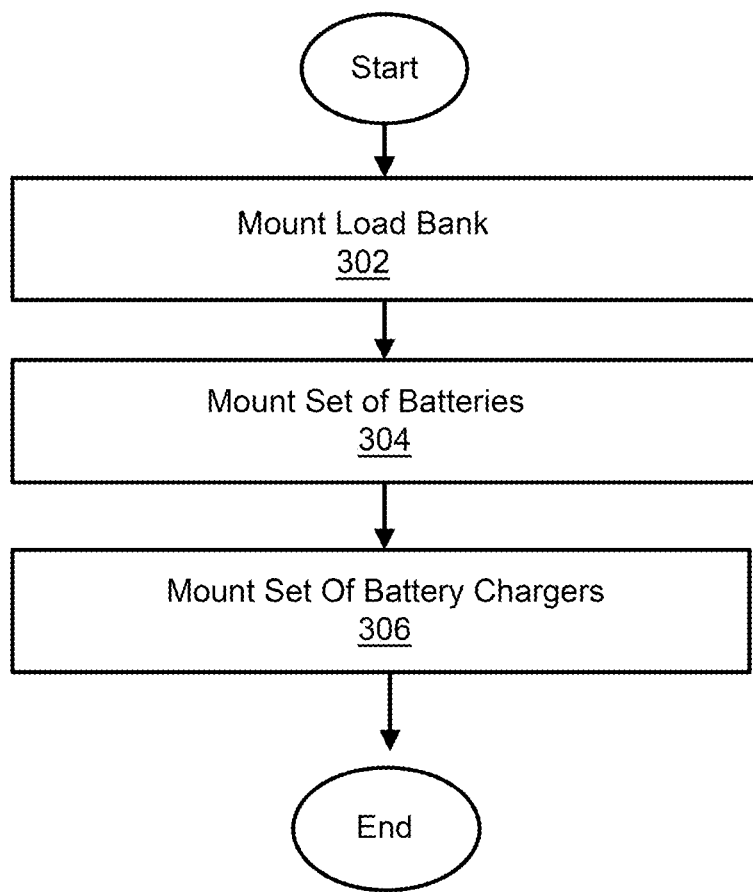
FIG. 3 illustrates a method of manufacture of a portable load bank apparatus, in accordance with one or more implementations.

FIG. 3 illustrates a method 300 of manufacture of a portable load bank apparatus, in accordance with one or more implementations. The operations of method 300 presented below are intended to be illustrative. In some implementations, method 300 may be accomplished with one or more additional operations not described, and/or without one or more of the operations discussed. Additionally, the order in which the operations of method 300 are illustrated in FIG. 3 and described below is not intended to be limiting.

In some implementations, method 300 may be implemented using one or more manual and/or automated manufacturing techniques. A manual manufacturing techniques may include one or more mounting techniques used by skilled artisans in vehicle manufacture, heavy equipment manufacture, load bank manufacture, commercial electricians, and/or other persons of skill in the art. A mounting technique may include one or more of welding, riveting, screwing, bolting, adhering, electrically coupling, and/or other techniques. Other techniques known to skilled artisans are also within the scope of the present disclosure. An automated manufacturing technique may include machines and one or more processing devices. The one or more processing devices and/or machines may include one or more devices executing some or all of the operations of method 300 in response to instructions stored electronically on an electronic storage medium. The one or more processing devices and/or machines may include one or more devices configured through hardware, firmware, and/or software to be specifically designed for execution of one or more of the operations of method 300.

At an operation 302, a load bank may be mounted on an electric vehicle.

At an operation 304, a set of batteries may be mounted on to the electric vehicle. The set of batteries may be electrically coupled to one or more of the load bank, a BMS, an electric motor, and/or other components.

At an operation 306, a set of battery chargers may be mounted on to the electric vehicle. The set of battery charges may be electrically coupled between the load bank and the set of batteries. The set of battery charges may be electrically coupled to other components.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

What is claimed is:

1. A load bank apparatus comprising:
one or more physical processors coupled to a load bank and configured by machine-readable instructions to:
cause one or more battery chargers to direct an amount of a power output received by the load bank to a set of batteries to charge the set of batteries, the power output being generated by an external power source and received at the load bank as part of a load test, and wherein an other amount of the power output not directed to the set of batteries is converted to thermal energy and dissipated as heat.

2. The load bank apparatus of claim 1, wherein the one or more physical processors are further configured by the machine-readable instructions to:
determine the amount of the power output directed to the set of batteries based on a current state of charge of the set of batteries.

3. The load bank apparatus of claim 1, further comprising the set of batteries.

4. The load bank apparatus of claim 1, further comprising the one or more battery chargers, wherein the one or more battery chargers includes:
an EV charger.

5. The load bank apparatus of claim 1, wherein the one or more physical processors are further configured by the machine-readable instructions to:
cause the external power source to generate the power output as part of the load test;
obtain an indication that the load test is complete; and
cause the power output by the external power source to be reduced.

6. The load bank apparatus of claim 1, wherein the one or more physical processors are further configured by the machine-readable instructions to:
determine the amount of the power output directed to the set of batteries based on an amount of travel power a vehicle needs to reach a destination.

7. The load bank apparatus of claim 1, further comprising the load bank, the one or more battery chargers, the set of batteries, and a battery monitoring system.

8. A system configured to load test a power source, the system comprising:
a load bank; and
one or more physical processors configured by machine-readable instructions to:
cause one or more battery chargers coupled to the load bank to direct an amount of a power output received by the load bank to a set of batteries coupled to the load bank to charge the set of batteries, the power output being generated by an external power source and received at the load bank as part of a load test, and wherein an other amount of the power output not directed to the set of batteries is converted to thermal energy and dissipated as heat.

9. The system of claim 8, wherein the one or more physical processors are further configured by the machine-readable instructions to:
determine the amount of the power output directed to the set of batteries based on a current state of charge of the set of batteries.

10. The system of claim 8, further comprising the set of batteries.

11. The system of claim 8, further comprising the one or more battery chargers, wherein the one or more battery chargers includes:
an EV charger.

12. The system of claim 8, wherein the one or more physical processors are further configured by the machine-readable instructions to:
cause the external power source to generate the power output as part of the load test;
obtain an indication that the load test is complete; and
cause the power output by the external power source to be reduced.

13. The system of claim 8, wherein the one or more physical processors are further configured by the machine-readable instructions to:
   determine the amount of the power output directed to the set of batteries based on an amount of travel power a vehicle carrying the load bank needs to reach a destination.

14. The system of claim 8, further comprising a vehicle configured to mount the load bank thereon, the one or more battery chargers, the set of batteries, and a battery monitoring system.

15. A method to control a load bank apparatus, the method comprising:
   causing one or more battery chargers of the load bank apparatus to direct an amount of a power output to a set of batteries to charge the set of batteries, the power output being generated by an external power source and received at the load bank as part of a load test, and wherein an other amount of the power output not directed to the set of batteries is converted to thermal energy and dissipated as heat.

16. The method of claim 15, further comprising:
   determining the amount of the power output directed to the set of batteries based on a current state of charge of the set of batteries.

17. The method of claim 15, wherein the set of batteries are included in the load bank apparatus.

18. The method of claim 17, wherein the one or more battery chargers are included in the load bank apparatus and include an EV charger.

19. The method of claim 15, further comprising:
   causing the external power source to generate the power output as part of the load test;
   obtaining an indication that the load test is complete; and
   causing the power output by the external power source to be reduced.

20. The method of claim 15, further comprising:
   determining the amount of the power output directed to the set of batteries based on an amount of travel power a vehicle needs to reach a destination.

\* \* \* \* \*